United States Patent
Nishiyama

(10) Patent No.: US 10,109,513 B2
(45) Date of Patent: Oct. 23, 2018

(54) SUBSTRATE TREATING APPARATUS

(71) Applicant: SOKUDO CO., LTD., Kyoto (JP)

(72) Inventor: Koji Nishiyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 1072 days.

(21) Appl. No.: 14/105,791

(22) Filed: Dec. 13, 2013

(65) Prior Publication Data

US 2014/0285790 A1    Sep. 25, 2014

(30) Foreign Application Priority Data

Mar. 25, 2013   (JP) .................. 2013-062052

(51) Int. Cl.
  *H01L 21/67*   (2006.01)
(52) U.S. Cl.
  CPC .............................. *H01L 21/67178* (2013.01)
(58) Field of Classification Search
  CPC .................................................. H01L 21/67178
  See application file for complete search history.

(56) References Cited

U.S. PATENT DOCUMENTS

| | | | |
|---|---|---|---|
| 2002/0088544 A1 | 7/2002 | Ueda et al. | 156/345.31 |
| 2006/0177586 A1* | 8/2006 | Ishida | H01L 21/67178 |
| | | | 427/299 |
| 2008/0014333 A1 | 1/2008 | Matsuoka et al. | 427/8 |
| 2009/0165712 A1* | 7/2009 | Ogura | H01L 21/6715 |
| | | | 118/695 |
| 2009/0202951 A1 | 8/2009 | Yamamoto et al. | 430/322 |

(Continued)

FOREIGN PATENT DOCUMENTS

| | | |
|---|---|---|
| JP | 2002-208554 A | 7/2002 |
| JP | 2009-194034 A | 8/2009 |

(Continued)

OTHER PUBLICATIONS

Machine Translation of JP2009231626 (Year: 2009).*
Office Action and Search Report dated Aug. 11, 2015 for corresponding Taiwan Patent Application No. 102143065.

*Primary Examiner* — Spencer E Bell
(74) *Attorney, Agent, or Firm* — Ostrolenk Faber LLP

(57) ABSTRACT

A substrate treating apparatus includes a treating section for treating substrates, and an interface section disposed adjacent the treating section and adjacent an exposing machine provided separately from the apparatus. The interface section has a first treating-section-side transport mechanism, a second treating-section-side transport mechanism, and an exposing-machine-side transport mechanism. Each of the first and second treating-section-side transport mechanisms is arranged to receive the substrates from the treating section, pass the substrates to the exposing-machine-side transport mechanism, receive the substrates from the exposing-machine-side transport mechanism and pass the substrates to the treating section. The exposing-machine-side transport mechanism is arranged to receive the substrates from the first and second treating-section-side transport mechanisms, transport the substrates to the exposing machine, receive the substrates after exposing treatment from the exposing machine, and pass the substrates to the first and second treating-section-side transport mechanisms.

19 Claims, 9 Drawing Sheets

(56) References Cited

U.S. PATENT DOCUMENTS

2010/0236587 A1    9/2010   Hamada et al. .............. 134/133
2012/0249990 A1   10/2012   Nishimura et al. ............. 355/72

FOREIGN PATENT DOCUMENTS

| JP | 2009-231626 A | 10/2009 |
| JP | 2009-260032 A | 11/2009 |
| JP | 2010-219434   | 9/2010  |
| JP | 2012-209288 A | 10/2012 |
| TW | 200745765     | 12/2007 |

* cited by examiner

SUBSTRATE TREATING APPARATUS

CROSS REFERENCE TO RELATED APPLICATIONS

This application claims priority to Japanese Patent Application No. 2013-062052 filed on Mar. 25, 2013, the entire contents of which are incorporated by reference herein.

TECHNICAL FIELD

This invention relates to a substrate treating apparatus for treating semiconductor wafers, glass substrates for photomasks, glass substrates for liquid crystal displays, substrates for plasma displays, substrates for optical disks, substrates for magnetic disks, or substrates for magneto-optical disks (hereinafter called simply substrates). More particularly, the invention relates to a technique for transferring the substrates to and from an exposing machine acting as an external apparatus.

BACKGROUND ART

Conventionally, this type of substrate treating apparatus includes a treating section and an interface section. The treating section coats the substrates with resist film, and develops the substrates. The interface section transfers the substrates to and from the exposing machine acting as external apparatus. This substrate treating apparatus operates as follows, for example. The treating section first coats the substrates with resist film, and sends the substrates to the interface section. The interface section sends the substrates received from the treating section to the exposing machine. The exposing machine exposes the substrates. The interface section receives the exposed substrates from the exposing machine and returns the substrates to the treating section. The treating section develops the exposed substrates.

The construction of the interface section is disclosed in detail in Japanese Unexamined Patent Publication No. 2010-219434, for example. According to this publication, the interface section has three transport mechanisms. The first transport mechanism receives the substrates from the treating section, and passes the substrates to the second transport mechanism. The second transport mechanism receives the substrates from the first transport mechanism, passes the substrates to the exposing machine, receives the exposed substrates from the exposing machine, and passes the exposed substrates to the third transport mechanism. The third transport mechanism receives the substrates from the second transport mechanism, and passes the substrates to the treating section.

However, the conventional example with such construction has the following problem. With the conventional apparatus, a stoppage of at least one of the first and second transport mechanisms will delay the substrate transport between the interface section and the treating section.

SUMMARY OF INVENTION

This invention has been made having regard to the state of the art noted above, and its object is to provide a substrate treating apparatus which can improve the reliability of substrate transport in the interface section.

In order to fulfill the above object, this invention provides the following construction.

A substrate treating apparatus, according to this invention, comprises:

a treating section for treating substrates; and
an interface section disposed adjacent the treating section and adjacent an exposing machine provided separately from the apparatus;
the interface section including:
a first treating-section-side transport mechanism;
a second treating-section-side transport mechanism; and
an exposing-machine-side transport mechanism;
wherein each of the first and second treating-section-side transport mechanisms is arranged to receive the substrates from the treating section, pass the substrates to the exposing-machine-side transport mechanism, receive the substrates from the exposing-machine-side transport mechanism and pass the substrates to the treating section; and
the exposing-machine-side transport mechanism is arranged to receive the substrates from the first and second treating-section-side transport mechanisms, transport the substrates to the exposing machine, receive the substrates after exposing treatment from the exposing machine, and pass the substrates to the first and second treating-section-side transport mechanisms.

With the substrate treating apparatus according to this invention, both the first and second treating-section-side transport mechanisms receive the substrates fed from the treating section, and transport the substrates to the treating section. Therefore, even when one of the treating-section-side transport mechanisms comes to a stoppage, the other will operate to continue transporting the substrates bidirectionally between the interface section and treating section. This can improve the reliability of substrate transport in the interface section.

In this invention, it is preferred that the first and second treating-section-side transport mechanisms are juxtaposed along a front face of the interface section adjacent the treating section; and the exposing-machine-side transport mechanism is disposed rearward of the first and second treating-section-side transport mechanisms.

With the first and second treating-section-side transport mechanisms juxtaposed along the front face of the interface section, the first and second treating-section-side transport mechanisms can transfer the substrates smoothly to and from the treating section. With the exposing-machine-side transport mechanism disposed rearward of the first and second treating-section-side transport mechanisms, the exposing-machine-side transport mechanism can transfer the substrates smoothly to and from the exposing machine.

The term "rearward" refers to a direction away from the front face of the interface section. For example, the term "rearward of the first treating-section-side transport mechanism" refers to a direction opposite from the front face of the interface section as seen from the first treating-section-side transport mechanism. The term "rearward of the second treating-section-side transport mechanism" refers to a direction opposite from the front face of the interface section as seen from the second treating-section-side transport mechanism.

In this invention, it is preferred that the interface section includes post-exposure baking units for heating the substrates after the exposing treatment; and each of the first and second treating-section-side transport mechanisms transports the substrates to and from the post-exposure baking units.

Each of the first and second treating-section-side transport mechanisms transports the substrates to and from the post-exposure baking units, and thereafter transfers the substrates to the treating section. Thus, even when one of the first and second treating-section-side transport mechanisms comes to a stoppage, the other will operate whereby the substrates received from the exposing-machine-side transport mechanism can be given post-exposure baking treatment according to a fixed schedule. This can inhibit a reduction in the quality of treatment in the interface section.

In this invention, it is preferred that the post-exposure baking units are arranged rearward of the first and second treating-section-side transport mechanisms.

Since the post-exposure baking units are arranged rearward of the first and second treating-section-side transport mechanisms, each of the first and second treating-section-side transport mechanisms can promptly transport the substrates received from the exposing machine to the post-exposure baking units.

In this invention, it is preferred that the exposing-machine-side transport mechanism and the post-exposure baking units are arranged vertically. That is, the exposing-machine-side transport mechanism and the post-exposure baking units, preferably, are stacked vertically.

This arrangement realizes a reduced installation area of the interface section. Besides, the first and second treating-section-side transport mechanisms can transport the substrates smoothly to both the post-exposure baking units and the exposing-machine-side transport mechanism.

In this invention, it is preferred that the post-exposure baking units include:
  first post-exposure baking units to and from which the substrates are transported solely by the first treating-section-side transport mechanism; and
  second post-exposure baking units to and from which the substrates are transported solely by the second treating-section-side transport mechanism; and
  wherein the first post-exposure baking units are arranged rearward of the first treating-section-side transport mechanism in plan view; and
  the second post-exposure baking units are arranged rearward of the second treating-section-side transport mechanism in plan view.

The first post-exposure baking units are arranged adjacent and rearward of the first treating-section-side transport mechanism. Therefore, the first treating-section-side transport mechanism can transport the substrates efficiently to the first post-exposure baking units. The second post-exposure baking units are arranged adjacent and rearward of the second treating-section-side transport mechanism. Therefore, the second treating-section-side transport mechanism can transport the substrates efficiently to the second post-exposure baking units.

In this invention, it is preferred that the interface section includes a cleaning portion for cleaning the substrates; and
  each of the first and second treating-section-side transport mechanisms transports the substrates to and from the cleaning portion.

With this construction, even when one of the first and second treating-section-side transport mechanisms comes to a stoppage, the other can operate to have the substrates cleaned appropriately. The substrates cleaned in the cleaning portion are substrates before the exposing treatment and/or substrates after the exposing treatment.

In this invention, it is preferred that the cleaning portion is disposed laterally of the first and second treating-section-side transport mechanisms.

Since the cleaning portion is disposed adjacent and laterally of the first and second treating-section-side transport mechanisms, each of the first and second treating-section-side transport mechanisms can transport the substrates smoothly to and from the cleaning portion.

In this invention, it is preferred that the cleaning portion includes:
  pre-exposure cleaning units for cleaning the substrates before the exposing treatment; and
  post-exposure cleaning units for cleaning the substrates after the exposing treatment;
  wherein the pre-exposure cleaning units and the post-exposure cleaning units are arranged vertically.

Each of the first and second treating-section-side transport mechanisms transports the substrates received from the treating section to and from the pre-exposure cleaning units before transfer to the exposing machine. Consequently, cleaning treatment can be given to the substrates before the exposing treatment. Further, each of the first and second treating-section-side transport mechanisms transports the substrates received from the exposing machine to and from the post-exposure cleaning units before transfer to the treating section. Consequently, cleaning treatment can be given to the substrates after the exposing treatment. In addition, the pre-exposure cleaning units and the post-exposure cleaning units stacked vertically can make the installation area of the cleaning portion compact.

In this invention, it is preferred that the cleaning portion includes:
  a first cleaning portion to and from which the substrates are transported solely by the first treating-section-side transport mechanism; and
  a second cleaning portion to and from which the substrates are transported solely by the second treating-section-side transport mechanism; and
  wherein the first cleaning portion, the first and second treating-section-side transport mechanisms and the second cleaning portion are juxtaposed in the stated order along a front face of the interface section.

With this construction, the first cleaning portion is disposed adjacent and laterally of the first treating-section-side transport mechanism. Therefore, the first treating-section-side transport mechanism can transport the substrates efficiently to and from the first cleaning portion. The second cleaning portion is disposed adjacent and laterally of the second treating-section-side transport mechanism. Therefore, the second treating-section-side transport mechanism can transport the substrates efficiently to and from the second cleaning portion.

In this invention, it is preferred that the interface section includes:
  post-exposure baking units for heating the substrates after the exposing treatment; and
  a cleaning portion for cleaning the substrates; and
  wherein each of the first and second treating-section-side transport mechanisms transports the substrates to and from the post-exposure baking units and the cleaning portion;
  the cleaning portion includes post-exposure cleaning units for cleaning the substrates after the exposing treatment; and
  the post-exposure cleaning units are arranged in substantially the same height position as the post-exposure baking units.

Each of the first and second treating-section-side transport mechanism transports the substrates received from the exposing-machine-side transport mechanism to the post-exposure cleaning units and the post-exposure baking units before transfer to the treating section. Consequently, not only post-exposure baking treatment but cleaning treatment can be given to the substrates after the exposing treatment. Further, since the post-exposure cleaning units and the post-exposure baking units are arranged in substantially the same height position, each of the first and second treating-section-side transport mechanisms can transport the substrates efficiently between the post-exposure cleaning units and the post-exposure baking units.

In this invention, it is preferred that the apparatus comprises:

treating-section-side receivers for allowing the first and second treating-section-side transport mechanisms and the treating section to transfer the substrates between each other;

wherein the treating-section-side receivers are arranged between the treating section and the interface section, and in positions substantially equidistant from the first and second treating-section-side transport mechanisms.

The treating-section-side receivers allow the first and second treating-section-side transport mechanisms, respectively, to receive the substrates from the treating section conveniently, and to pass the substrates to the treating section conveniently. An amount of operation of the first treating-section-side transport mechanism for receiving the substrates from the treating section and an amount of operation of the second treating-section-side transport mechanism for receiving the substrates from the treating section can also be made substantially equal. Similarly, the first and second treating-section-side transport mechanisms are substantially equal with each other in the amount of operation for passing the substrates to the treating section. The phrase "arranged between the treating section and the interface portion" means that at least part of the treating-section-side receivers may be located in the treating section, or may be located in the interface section. For example, the treating-section-side receivers may be installed to extend between the treating section and the interface section. Or the entirety of the treating-section-side receivers may be located outside the treating section, or may be located outside the interface section.

In this invention, it is preferred that the interface section includes intermediate receivers for allowing the first and second treating-section-side transport mechanisms and the exposing-machine-side transport mechanism to transfer the substrates between each other; and the intermediate receivers are arranged in positions substantially equidistant from the first and second treating-section-side transport mechanisms.

With this construction, each of the first and second treating-section-side transport mechanisms can pass the substrates to the exposing-machine-side transport mechanism conveniently, and receive the substrates from the exposing-machine-side transport mechanism conveniently. The first and second treating-section-side transport mechanisms are substantially equal to each other in the amount of operation for passing the substrates to the exposing-machine-side transport mechanism, and in the amount of operation for receiving the substrates from the exposing-machine-side transport mechanism.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DESCRIPTION OF EMBODIMENTS

An embodiment of this invention will be described hereinafter with reference to the drawings.

[Outline of Substrate Treating Apparatus]

Figure 1:
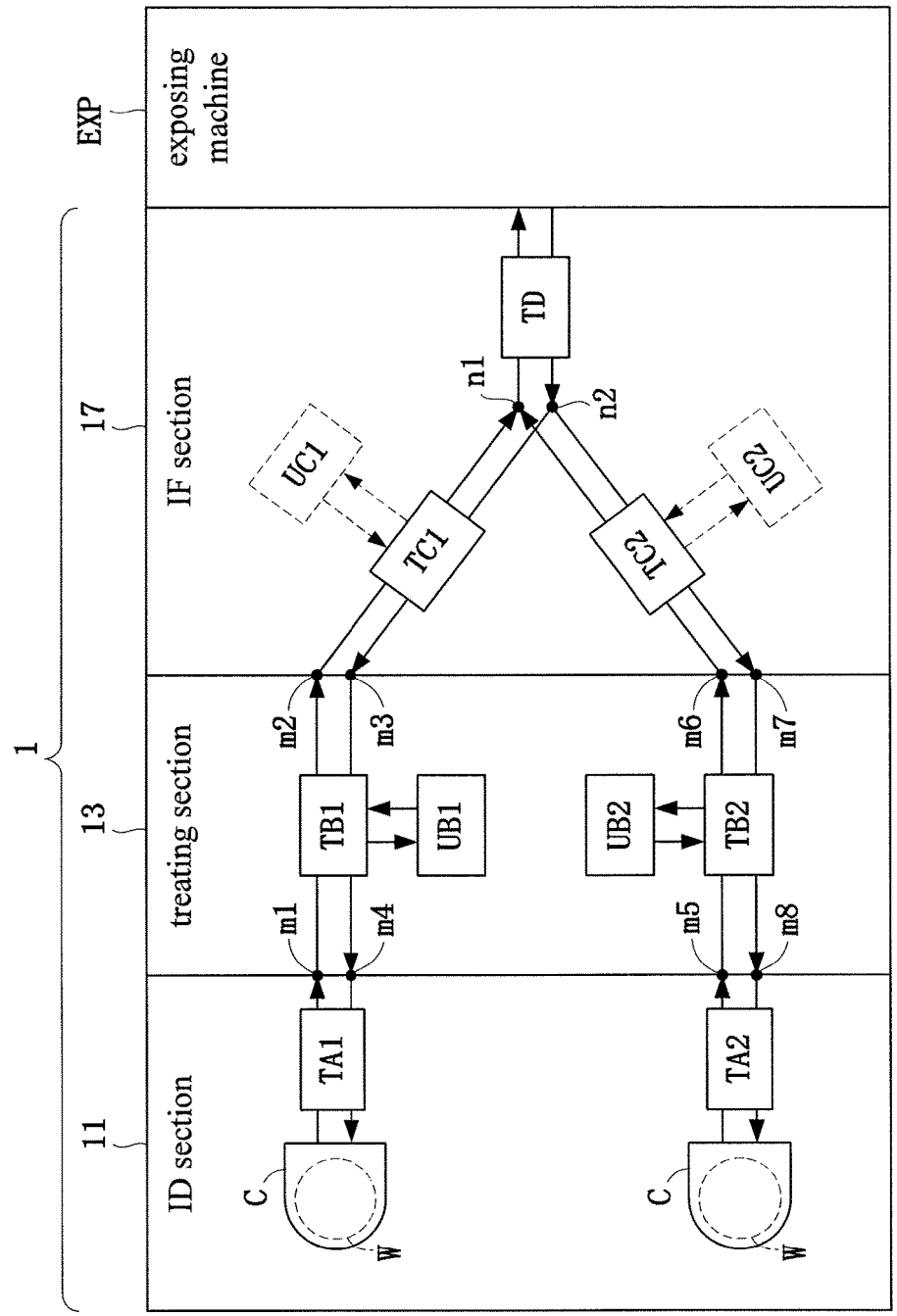
FIG. 1 is a schematic view showing an outline construction of a substrate treating apparatus according to this invention.

First, an outline of this embodiment will be described. FIG. 1 is a schematic view showing an outline construction of a substrate treating apparatus in this embodiment.

A substrate treating apparatus 1 includes an indexer section (hereinafter referred to as "ID section") 11, a treating section 13 and an interface section (hereinafter referred to as "IF section") 17. The treating section 13 adjoins the ID section 11 and IF section 17, respectively. The IF section 17 further adjoins an exposing machine EXP which is separate from the substrate treating apparatus 1.

The ID section 11 can accommodate a plurality of carriers C. Each carrier C stores substrates (e.g. semiconductor wafers) W. The ID section 11 has a plurality of ID transport mechanisms (hereinafter simply called "transport mechanisms" as appropriate) TA1 and TA2 installed in the ID section 11. Each transport mechanism TA1 or TA2 transports the wafers W between each carrier C and the treating section 13.

The treating section 13 has treating units UB1 and UB2 for treating the wafers W, and treating-section transport mechanisms (hereinafter simply called "transport mechanisms" as appropriate) TB1 and TB2 for transporting the wafers W. The wafers W are transported to and from the treating unit UB1 solely by the transport mechanism TB1. The wafers W are transported to and from the treating unit UB2 solely by the transport mechanism TB2. Further, each transport mechanism TB1 or TB2 transports the wafers W between the ID section 11 and the IF section 17.

The IF section 17 has a first treating-section-side transport mechanism (hereinafter simply called "transport mechanism" as appropriate) TC1, a second treating-section-side transport mechanism (hereinafter simply called "transport mechanism" as appropriate) TC2, and a single exposing-machine-side transport mechanism (hereinafter simply called "transport mechanism" as appropriate) TD. Each transport mechanism TC1 or TC2 receives the wafers W fed from the treating section 13, and passes the wafers W to the treating section 13. The transport mechanism TD receives the wafers W from the transport mechanisms TC1 and TC2, transports these wafers W to the exposing machine EXP, receives the wafers W after exposing treatment from the exposing machine EXP, and passes the exposed wafers W to the transport mechanisms TC1 and TC2.

An example of operation of this substrate treating apparatus 1 will be described. The transport mechanism TA1 transports wafers W from inside a carrier C and passes the wafers W to the transport mechanism TB1. The transport mechanism TB1 transports the received wafers W to the predetermined treating unit UB1. Thereafter the transport mechanism TB1 passes the wafers W to the transport mechanism TC1. The transport mechanism TC1 passes the received wafers W to the transport mechanism TD. The transport mechanism TD transports the received wafers W to the exposing machine EXP. The transport mechanism TD receives the wafers W from the exposing machine EXP, and passes the wafers W to the transport mechanism TC1. The transport mechanism TC1 passes the received wafers W to the transport mechanism TB1. The transport mechanism TB1 transports the received wafers W to the predetermined treating unit UB1. Thereafter the transport mechanism TB1 passes the wafers W to the transport mechanism TA1. The transport mechanism TA1 loads the received wafers W into the carrier C.

Similarly, the transport mechanisms TA2, TB2, TC2 and TD also transfer the wafers W to one another. Consequently, the wafers W are transported forward and backward between the ID section 11 and the exposing machine EXP.

In FIG. 1, each of points m1 through m8, n1 and n2 schematically indicates a position where the wafers W are transferred from one transport mechanism to another.

As a result, two transport paths are formed to extend between the ID section 11 and the exposing machines EXP. A portion between the IF section 17 (transport mechanism TD) and the exposing machine EXP is common to the respective transport paths. On the other hand, the two transport paths are distinct from each other in a portion between the ID section 11 (carriers C) and the IF section 17 (transport mechanism TD). Therefore, in the portion between the ID section 11 and the IF section 17, even when an abnormality occurs to one transport path, wafers W can be transported appropriately through the other transport path.

In particular, both of the two treating-section-side transport mechanisms TC1/TC2 provided in the IF section 17 transport wafers W to and from the treating section 13. Therefore, even when one of the transport mechanisms TC1/TC2 breaks down, the other can operate to continue transporting the wafers W bidirectionally between the treating section 13 and the IF section 17. That is, improvement can be made at the same time in the reliability of wafer transport from the treating section 13 to the IF section 17 and in the reliability of wafer transport from the IF section 17 to the treating section 13.

Where treating units are installed in the IF section 17, a construction can be made for the respective transport mechanisms TC1 and TC2 to transport the wafers W to and from the treating units. This can also improve the reliability of treatment in the IF section 17. Even when the transport mechanism TC1 breaks down, for example, the transport mechanism TC2 can be operated to realize treatment of the wafers W in the IF section 17 according to an appropriate schedule.

FIG. 1 shows, in dotted lines, treating units UC1 and UC2 installed in the IF section 17. To and from the treating unit UC1 the transport mechanism TC1 transports the wafers W. To and from the treating unit UC2 the transport mechanism TC2 transports the wafers W. In such an example of construction, even when the treating unit UC1 or transport mechanism TC1 breaks down, for example, treatment of the wafers W can be carried out in the IF section 17 according to an appropriate schedule by using the treating unit UC2 and transport mechanism TC2.

The treatment carried out by the treating unit UB1 for the wafers W received by the transport mechanism TB1 from the transport mechanism TA1, and the treatment carried out by the treating unit UB1 carried out for the wafers W received by the transport mechanism TB1 from the transport mechanism TC1, may be the same or may be different. In the example of operation described above, the treating unit UB1 treats both the wafers W received by the transport mechanism TB1 from the transport mechanism TA1 and the wafers W received by the transport mechanism TB1 from the transport mechanism TC1, but this is not limitative. For example, the treating unit UB1 may treat either the wafers W sent from the transport mechanism TA1 or the wafers W sent from the transport mechanism TC1. The same may be said of the treating unit UB2.

[Overall Construction of Substrate Treating Apparatus]

Each component of the above substrate treating apparatus 1 will be described in greater detail. Here, an example is taken where the treatment in the treating section 13 includes resist film coating treatment and developing treatment. The exposing machine EXP exposes the wafers W by the immersion method, for example. As a further example, treating units are installed in the IF section 17.

Figure 2:
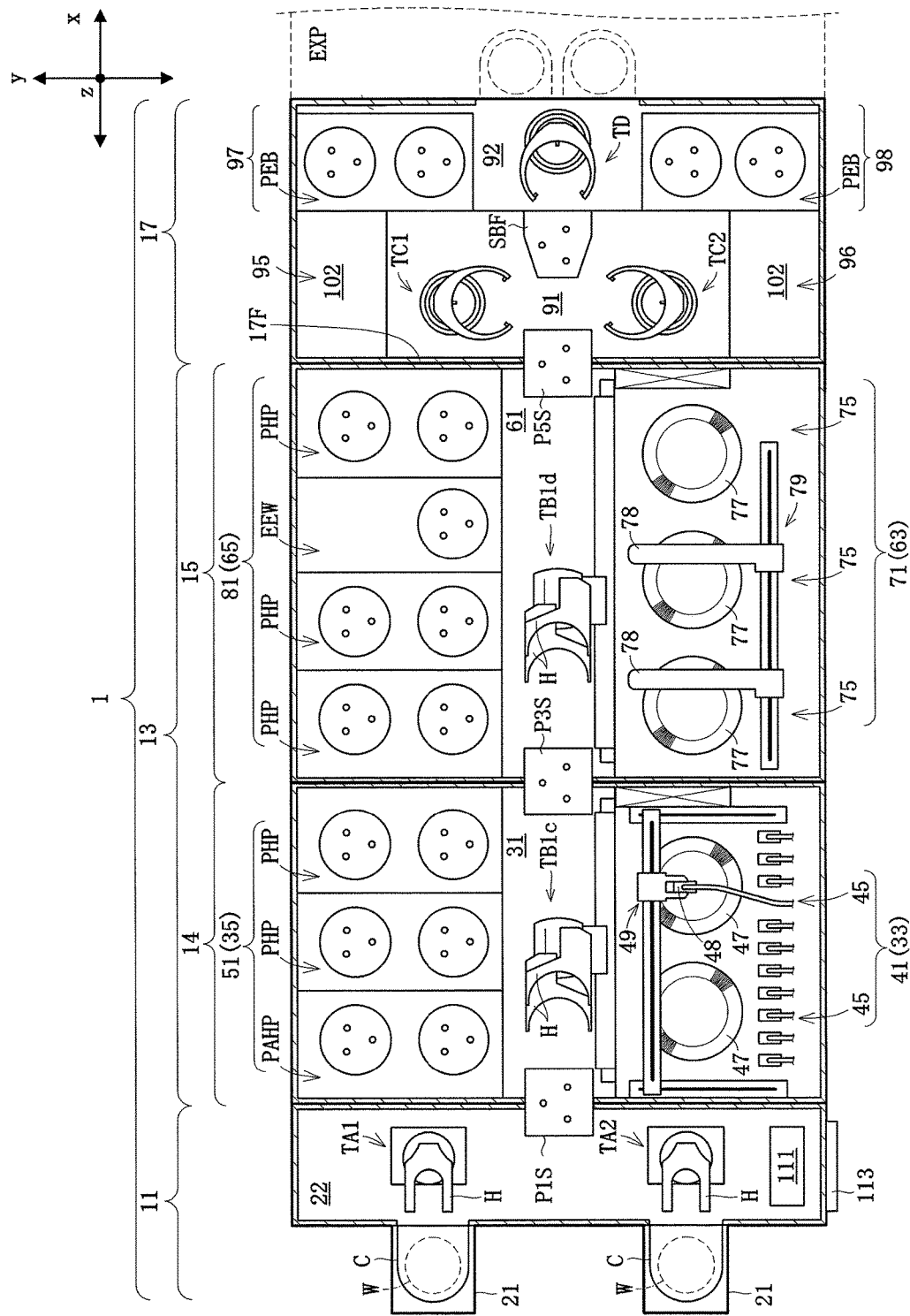
FIG. 2 is a plan view showing the outline construction of the substrate treating apparatus.

FIG. 2 is a plan view showing an outline construction of the substrate treating apparatus in this embodiment. The treating section 13 is divided into a first block 14 and a second block 15. The ID section 11, first block 14, second block 15, IF section 17 and exposing machine EXP are arranged successively in the stated order in one horizontal direction (in the direction of "x" in the drawings). A horizontal direction perpendicular to the x-direction is regarded as the direction of "y", and the vertical direction as the direction of "z".

[ID Section]

Figure 3:
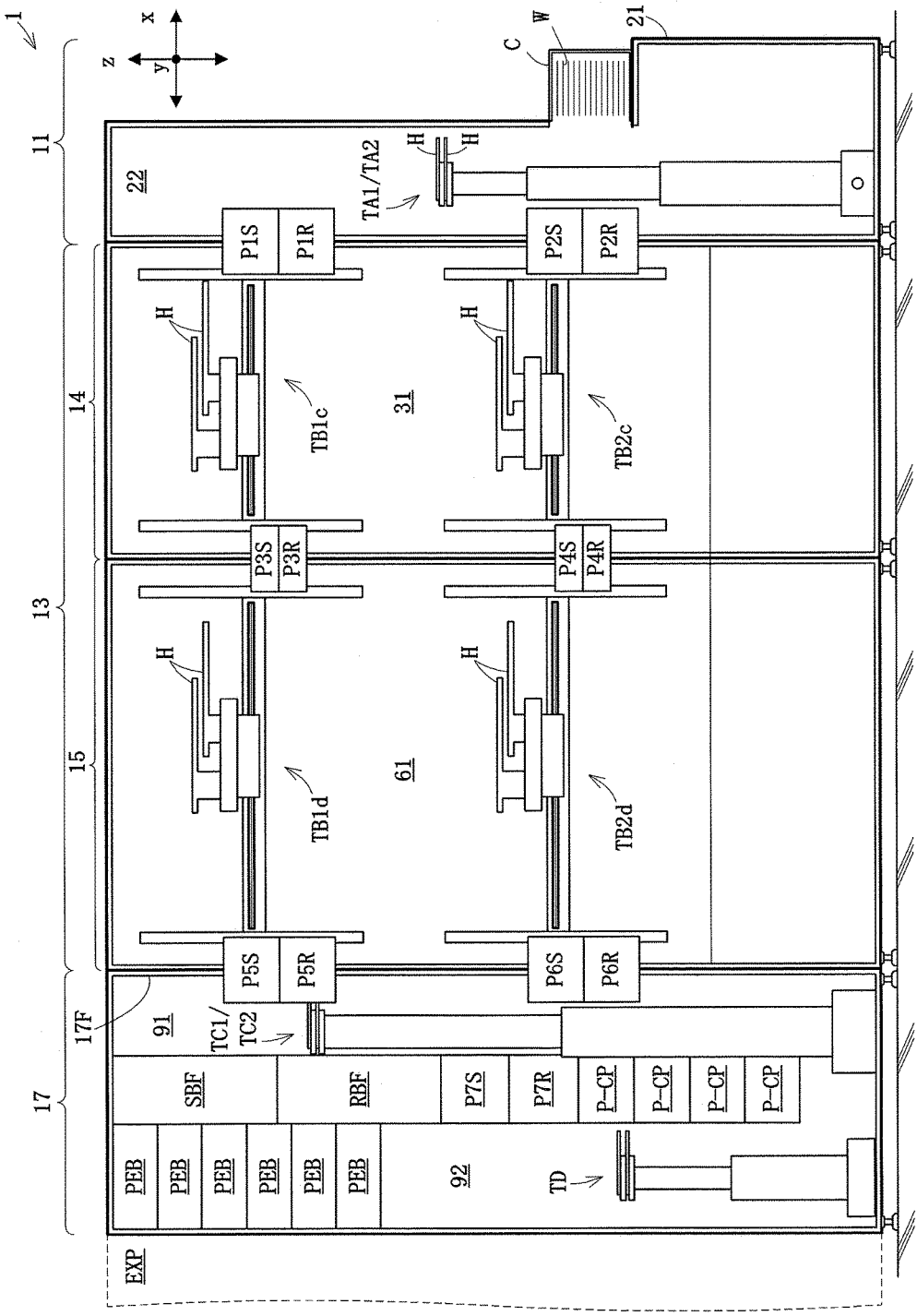
FIG. 3 is a schematic side view showing an arrangement of transport mechanisms.

Reference is made to FIG. 3 along with FIG. 2. FIG. 3 is a schematic side view showing an arrangement of transport mechanisms when an interior of the substrate treating apparatus is seen from a side (in the y-direction).

As shown in FIGS. 2 and 3, the ID section 11 includes carrier tables 21 and a transport portion 22.

The carrier tables 21 receive carries C placed thereon. The carriers C are placed on the carrier tables 21, for example, by an external transport mechanism not shown. Each carrier C has a plurality of wafers W stored in a horizontal position therein. The carriers C are in form of FOUPs (front opening unified pods), for example.

The ID transport mechanisms TA1 and TA2 are installed in the transport portion 22. The transport mechanisms TA1 and TA2 are arranged side by side in the y-direction. The transport mechanisms TA1 and TA2 are what is called transport robots. That is, each of the transport mechanisms TA1 and TA2 has one or more hand(s) H for holding wafers W, and various drive mechanisms (not shown) for moving the hand(s) H. Each transport mechanism TA1 or TA2 transports the wafers W by moving the hand(s) H holding the wafers W. The hand(s) H is/are, for example, capable of parallel translation in each of the x-direction, y-direction and z-direction, movable forward and backward radially of the vertical axis of the transport mechanism TA1 or TA2, and rotatable about the vertical axis.

The other transport mechanisms TB1 through TD are the same as the transport mechanisms TA1 and TA2 in holding and transporting the wafers W with hands H, apart from shapes of the transport mechanisms TB1 through TD per se and ranges of movement of their hands.

[Treating Section 13—First Block 14]

Figure 4:
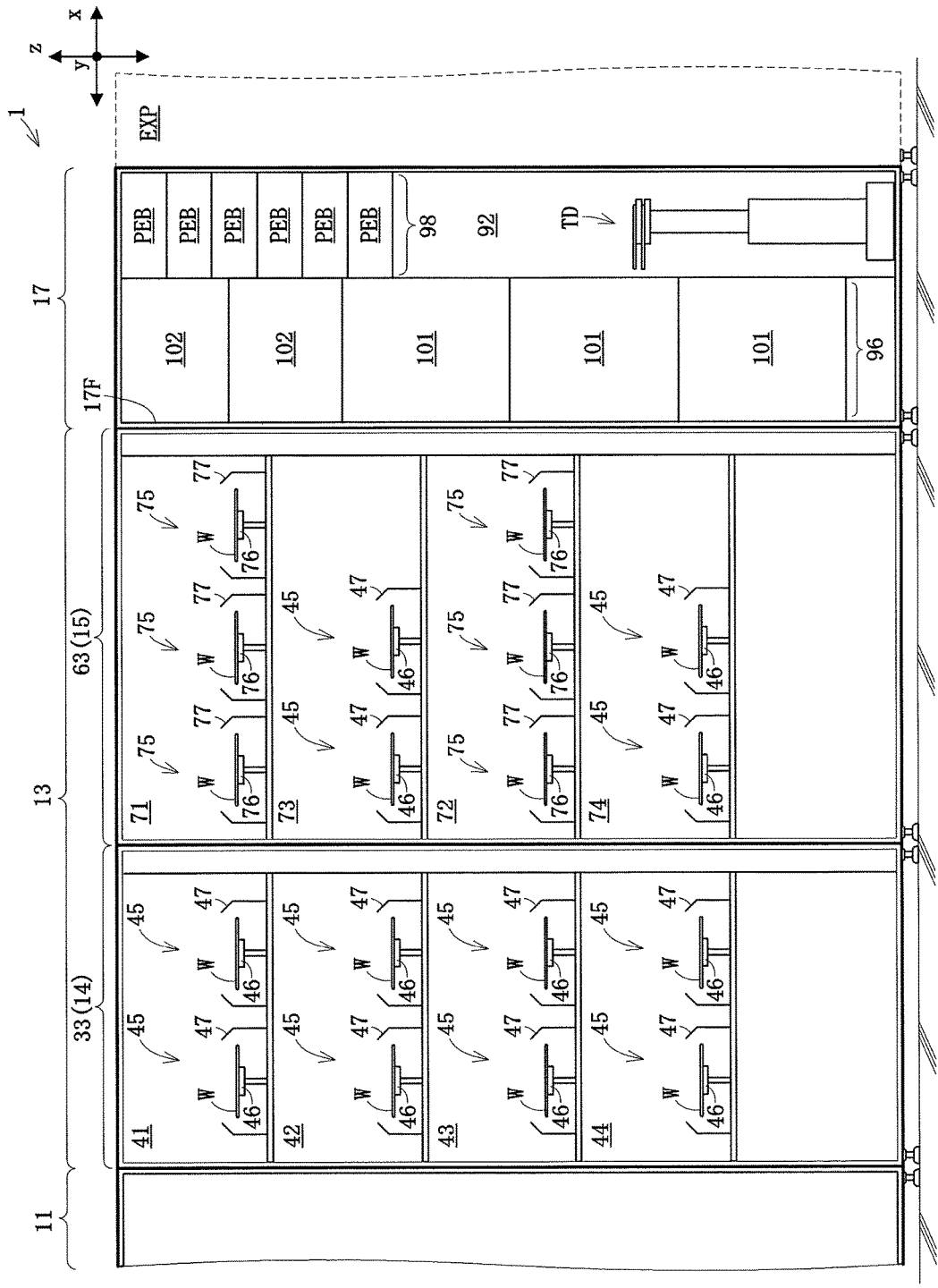
FIG. 4 is a schematic side view of the substrate treating apparatus showing an arrangement of solution treating units.
Figure 5:
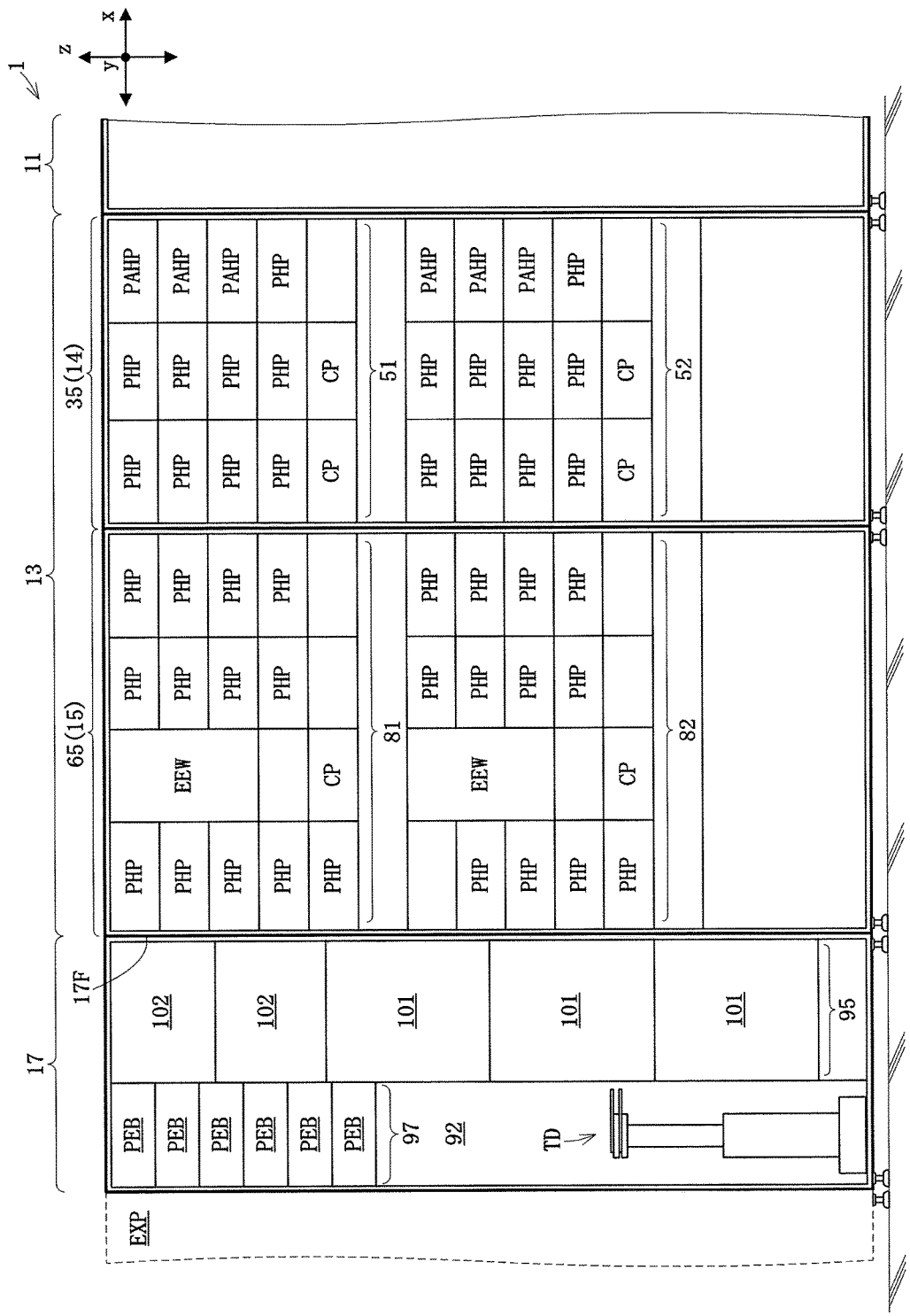
FIG. 5 is a schematic side view of the substrate treating apparatus showing an arrangement of heat treating units.
Figure 6:
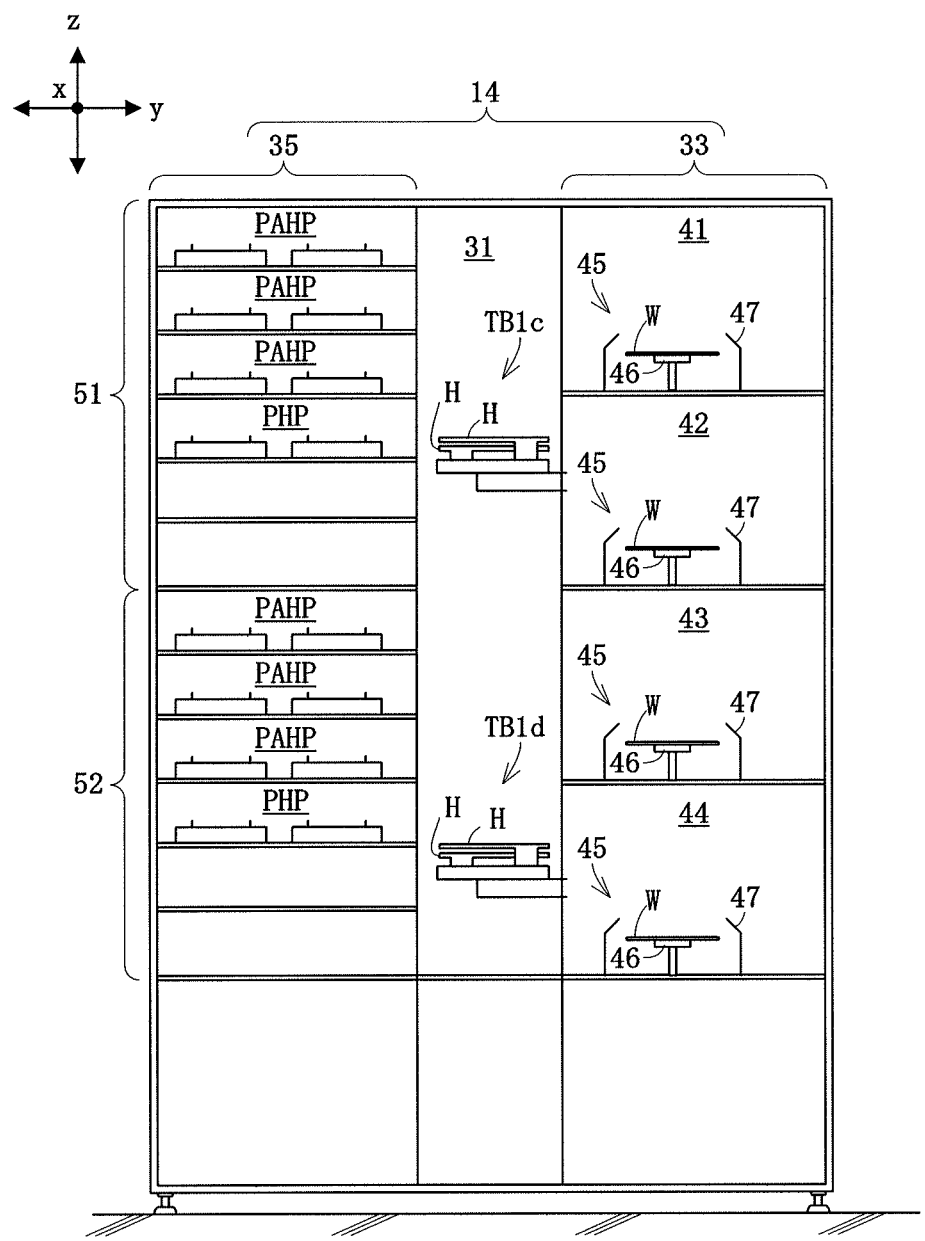
FIG. 6 is a front view showing an interior of a first block.

Reference is made to FIGS. 2 through 6. FIG. 4 is a schematic side view showing an arrangement of solution treating units when an interior of the substrate treating apparatus is seen from a side (in the y-direction). FIG. 5 is a schematic side view showing an arrangement of heat treating units when an interior of the substrate treating apparatus is seen from a side (in the y-direction). FIG. 6 is a front view when an interior of a first block is seen from the direction of arrangement (in the x-direction).

The first block 14 has a transport portion 31, a solution treating portion 33 and a heat treating portion 35. The transport portion 31 is a beltlike area extending in the x-direction (direction of arrangement) substantially through the middle in the y-direction (width direction) of the first block 14 in plan view. The transport portion 31 has opposite ends thereof facing the ID section 11 and a second block 15, respectively. The solution treating portion 33 is located on one side of the transport portion 31. The heat treating portion 35 is located on the other side of the transport portion 31.

As shown in FIGS. 3 and 6, the transport portion 31 has treating-section transport mechanisms TB1c and TB2c installed therein. The transport mechanisms TB1c and TB2c are arranged in the vertical direction (in the z-direction). An upper part of the transport portion 31 is a range of movement of the transport mechanism TB1c. A lower part of the transport portion 31 is a range of movement of the transport mechanism TB2c. Each of the transport mechanisms TB1c and TB2c is capable of parallel translation in the x-direction and z-direction. FIG. 2 shows only the transport mechanism TB1c disposed in the upper part.

The ID section 11 and the first block 14 have receivers P1S, P1R, P2S and P2R provided therebetween. The receivers P1S, P1R, P2S and P2R are arranged vertically. The transport mechanism TA1 places wafers W on the receiver P1S, and the transport mechanism TB1c receives the wafers W placed on the receiver P1S. The transport mechanism TB1c places wafers W on the receiver P1R, and the transport mechanism TA1 receives the wafers W placed on the receiver P1R. Similarly, the receivers P2S and P2R are used for passing wafers W bidirectionally between the transport mechanism TA2 and the transport mechanism TB2c. The receivers P1S, P1R, P2S and P2R correspond to the points m1, m4, m5 and m8 in FIG. 1.

Reference is made to FIG. 4. The solution treating portion 33 has four coating treatment chambers 41, 42, 43 and 44. These coating treatment chambers 41 through 44 are arranged vertically. The coating treatment chambers 41 and 42 are arranged in an upper part of the solution treating portion 33. The coating treatment chambers 43 and 44 are arranged in a lower part of the solution treating portion 33. Each of the coating treatment chambers 41 through 44 faces the transport portion 31. The transport mechanism TB1c transports wafers W into and out of the upper coating treatment chambers 41 and 42. The transport mechanism TB2c transports wafers W into and out of the lower coating treatment chambers 43 and 44.

Each of the coating treatment chambers 41 through 44 has a plurality of coating units 45 installed therein. Each coating unit 45 includes a holder 46, a cup 47, nozzles 48 and a nozzle transport mechanism 49. The nozzles 48 and nozzle transport mechanism 49 are shown in FIG. 2. The holder 46 holds a wafer W. The holder 46 is rotatable by a motor not shown. The cup 47 is disposed around the holder 46 for collecting a treating solution scattering from the wafer W. Each nozzle 48 discharges the treating solution to the wafer W. The nozzle transport mechanism 49 transports each nozzle 48 between a position over the wafer W and a position away from over the wafer W.

Each coating unit 45 in the coating treatment chamber 41 or 43 applies a treating solution to the wafer W to form resist film on the wafer W. The nozzles 48 provided for these coating units 45 discharge the treating solution for forming resist film. Each coating unit 45 in the coating treatment chamber 42 or 44 applies a treating solution to the wafer W to form antireflection film on the wafer W. The nozzles 48 provided for these coating units 45 discharge the treating solution for forming antireflection film.

Reference is made to FIG. 5. The heat treating portion 35 has a plurality of heat treating units. The heat treating units are arranged in a matrix form when seen from a side (e.g. three columns in the horizontal direction (the x-direction) and ten rows in the vertical direction (the z-direction)). Here, the plurality of heat treating units arranged in the five upper rows are called "heat treating unit group 51", and the plurality of heat treating units arranged the five lower rows "heat treating unit group 52". The transport mechanism TB1c transports wafers W into and out of the heat treating unit group 51. The transport mechanism TB2c transports wafers W into and out of the heat treating unit group 52.

Each of the heat treating unit groups 51 and 52 includes a plurality of heat treating units PHP, a plurality of adhesion promoting units PAHP and a plurality of cooling units CP. The heat treating units PHP heat and cool the wafers W. The adhesion promoting units PAHP coat the wafers W with an adhesion promoter such as HMDS (hexamethyldisilazane), and heat the wafers W. This improves adhesion of the antireflection film to the wafers W. The cooling units CP cool the wafers W.

The coating units 45 in the coating treatment chambers 41 and 42 and the heat treating unit group 51 belong to the treating unit UB1 for the transport mechanism TB1 shown in FIG. 1. The coating units 45 in the coating treatment chambers 43 and 44 and the heat treating unit group 52 belong to the treating unit UB2 for the transport mechanism TB2.

[Treating Section 13—Second Block 15]

The second block 15 has a transport portion 61, a solution treating portion 63 and a heat treating portion 65. The transport portion 61 is formed substantially in the middle of the second block 15 in plan view. The transport portion 61 has opposite ends thereof facing the first block 14 (transport portion 31) and the IF section 17, respectively. The solution treating portion 63 is located on one side of the transport portion 61. The heat treating portion 65 is located on the other side of the transport portion 61.

The transport portion 61 has transport mechanisms TB1d and TB2d arranged in the vertical direction (in the z-direction). An upper part of the transport portion 61 is a range of movement of the transport mechanism TB1d. A lower part of the transport portion 61 is a range of movement of the transport mechanism TB2d.

Receivers P3S, P3R, P4S and P4R are provided between the transport portion 61 and the transport portion 31. The receivers P3S/P3R are used when wafers W are transferred between the transport mechanism TB1d and the transport mechanism TB1c. The receivers P4S/P4R are used when wafers W are transferred between the transport mechanism TB2d and the transport mechanism TB2c.

The solution treating portion 63 has two developing treatment chambers 71 and 72 and two coating treatment chambers 73 and 74. These treatment chambers 71 through 74 are arranged vertically. The treatment chambers 71 and 73 are arranged in an upper part of the solution treating portion 63. The treatment chambers 72 and 74 are arranged in a lower part of the solution treating portion 63. Each of the treatment chambers 41 through 44 faces the transport portion 61. The transport mechanism TB1$d$ transports wafers W into and out of the treatment chambers 71 and 73. The transport mechanism TB2$d$ transports wafers W into and out of the treatment chambers 72 and 74.

Each of the developing treatment chambers 71 and 72 has a plurality of developing units 75 arranged therein. Each of the coating treatment chambers 73 and 74 has a plurality of coating units 45 arranged therein.

Each developing unit 75 includes a holder 76, a cup 77, a nozzle 78 and a nozzle transport mechanism 79. The nozzle 78 and nozzle transport mechanism 79 are shown in FIG. 2. The holder 76 holds a wafer W. The holder 76 is rotatable by a motor not shown. The cup 77 is disposed around the holder 76 for collecting a developer scattering from the wafer W. The nozzle 78 discharges the developer to the wafer W. The nozzle transport mechanism 79 transports the nozzle 78 between a position over the wafer W and a position away from over the wafer W.

Each coating unit 45 in the coating treatment chamber 73 or 74 applies a treating solution to the wafer W to form resist cover film on the wafer W. The nozzles 48 provided for these coating units 45 discharge the treating solution for forming the resist cover film.

The heat treating portion 65 has a plurality of heat treating units arranged in a matrix of rows and columns. The transport mechanism TB1$d$ transports wafers W into and out of an upper heat treating unit group 81. The transport mechanism TB2$d$ transports wafers W into and out of a lower heat treating unit group 82.

Each of the heat treating unit groups 81 and 82 includes a plurality of heat treating units PHP and a plurality of cooling units CP. Each of the heat treating unit groups 81 and 82 includes also an edge exposing unit EEW installed in one location thereof. The edge exposing unit EEW exposes peripheral regions of the wafers W.

The developing units 75 in the developing treatment chamber 71, the coating units 45 in the coating treatment chamber 73 and the heat treating unit group 81 belong to the treating unit UB1 noted hereinbefore. The edge exposing unit EEW disposed in an upper part of the heat treating portion 65 also belongs to the treating unit UB1. The developing units 75 in the developing treatment chamber 72, the coating units 45 in the coating treatment chamber 74 and the heat treating unit group 82 belong to the treating unit UB2. The edge exposing unit EEW disposed in a lower part of the heat treating portion 65 also belongs to the treating unit UB2.

[IF Section 17]

Figure 7:
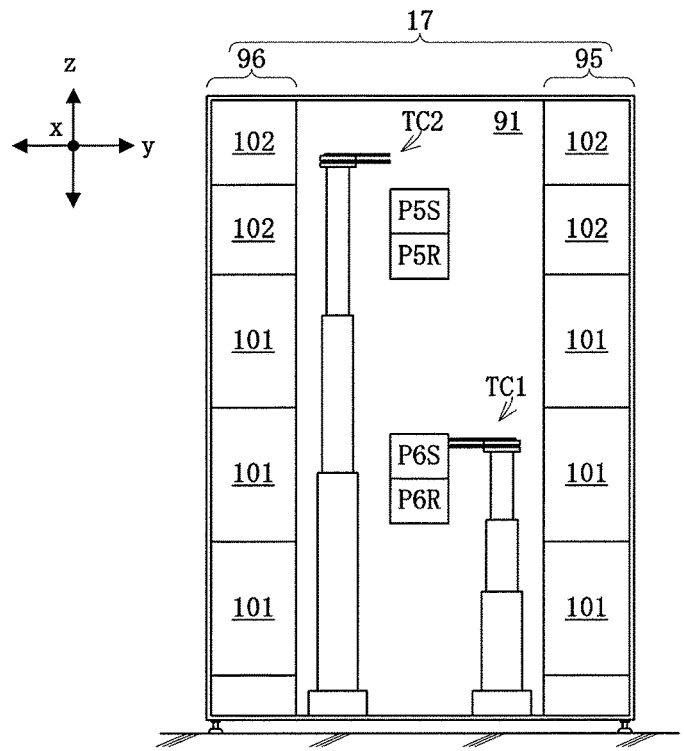
FIG. 7 is a rear view showing an interior of an interface section when a first and a second treating-section-side transport mechanisms are seen from a back side.
Figure 8:
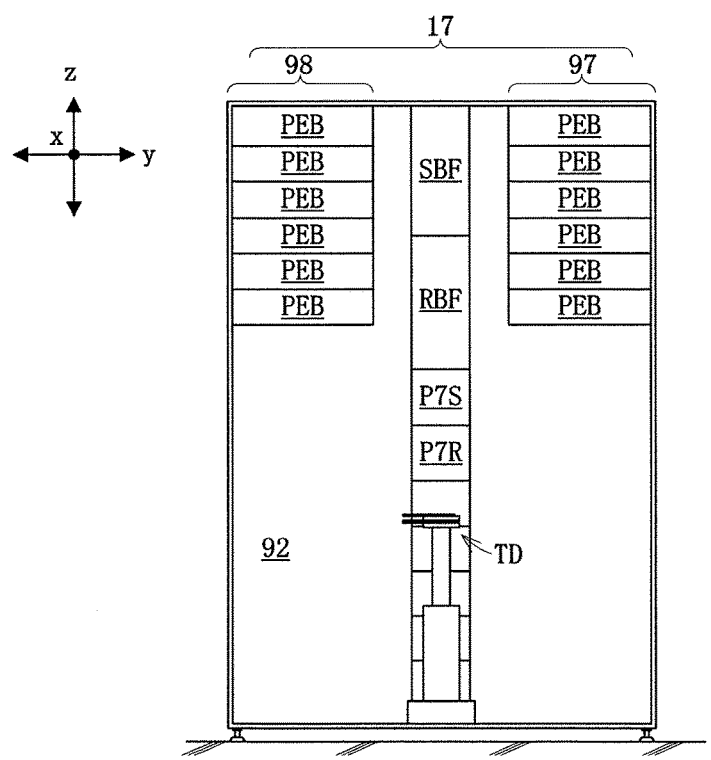
FIG. 8 is a rear view showing the interior of the interface section when an exposing-machine-side transport mechanism is seen from a back side.
Figure 9:
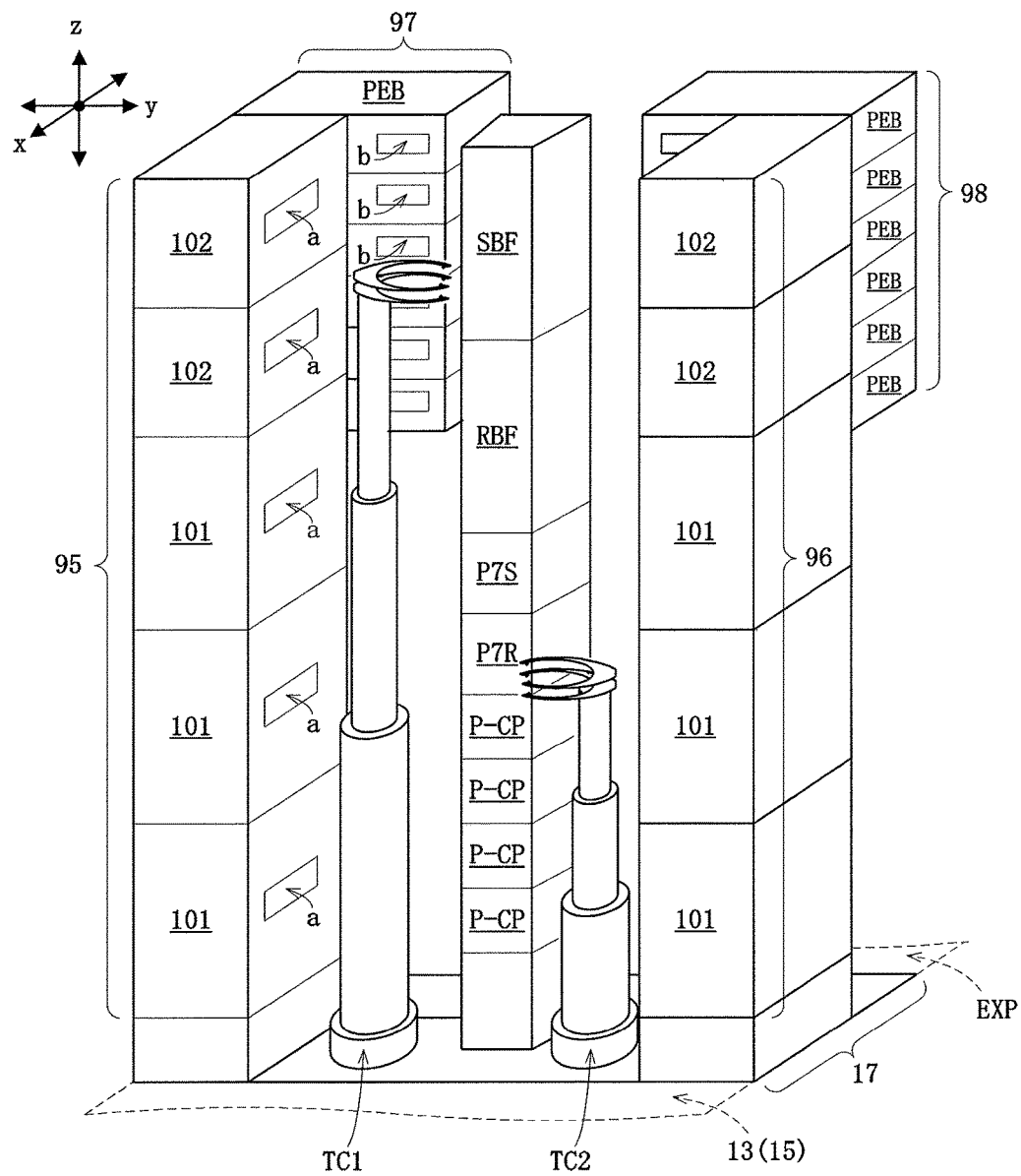
FIG. 9 is a perspective view of the interior of the interface section seen from a front side.
Figure 10:
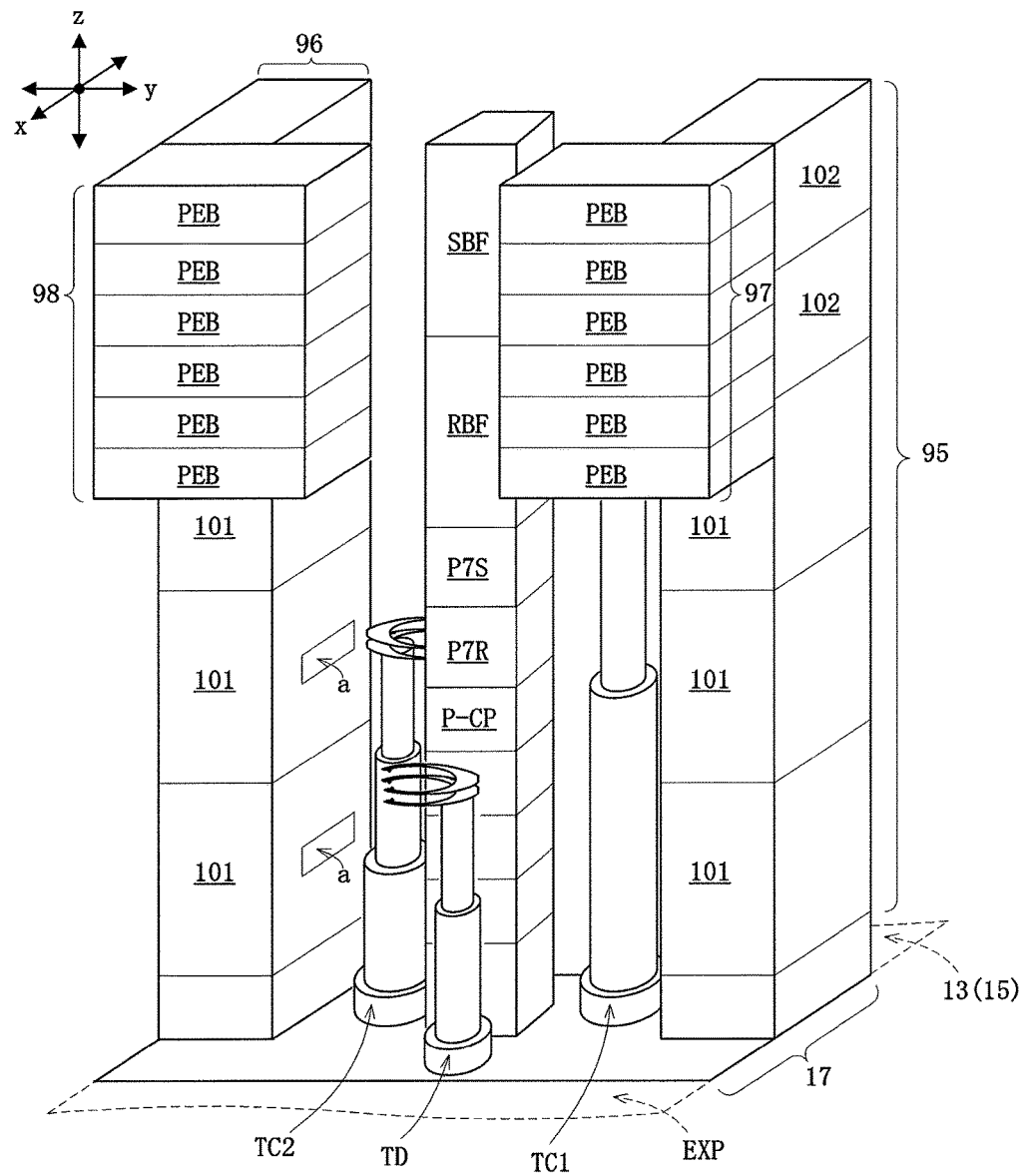
FIG. 10 is a perspective view of the interior of the interface section seen from a back side.

Reference is made to FIGS. 2 through 10. FIG. 7 is a rear view of the treating-section-side transport mechanisms TC1 and TC2 seen from a back side (i.e. from the exposing machine EXP). FIG. 8 is a rear view of the exposing-machine-side transport mechanism TD seen from a back side. FIG. 9 is a perspective view of the interface section seen from a front side. FIG. 10 is a perspective view of the interface section seen from a back side.

The IF section 17 has a treating-section-side transport portion 91, an exposing-machine-side transport portion 92, cleaning portions 95 and 96, and heat treating portions 97 and 98. When the IF section 17 is divided into a portion adjacent the treating section 13 and a portion adjacent the exposing machine EXP in plan view, the treating-section-side transport portion 91 and the cleaning portions 95 and 96 are arranged in the portion adjacent the treating section 13. The exposing-machine-side transport portion 92 and the heat treating portions 97 and 98 are arranged in the portion adjacent the exposing machine EXP. The treating-section-side transport portion 91 faces the treating section 13 (transport portion 61). The exposing-machine-side transport portion 92 faces the exposing machine EXP. The transport portions 91 and 92 adjoin each other.

For describing a layout in the IF section 17 hereinafter, the plane on which the IF section 17 contacts the treating section 13 (second block 15) will be called the front face 17F. The direction perpendicular to the front face 17F in plan view will be called the "fore and aft direction" as appropriate. In this embodiment, the fore and aft direction coincides with the x-direction. As seen from inside the IF section 17, the directions toward and away from the front face 17F will be called "forward" and "backward", respectively.

The treating-section-side transport portion 91 and cleaning portions 95 and 96 are arranged side by side along the front face 17F. The treating-section-side transport portion 91 is disposed in the middle in the y-direction (width direction) of the IF section 17. The cleaning portions 95 and 96 are arranged adjacent opposite outward ends in the y-direction of the treating-section-side transport portion 91.

The exposing-machine-side transport portion 92 and heat treating portions 97 and 98 are arranged adjacent and rearward of the treating-section-side transport portion 91 and cleaning portions 95 and 96. The exposing-machine-side transport portion 92 is a lower rearward area in the IF section 17. The heat treating portions 97 and 98 are arranged above the exposing-machine-side transport portion 92. The heat treating portions 97 and 98 are arranged side by side in the y-direction.

The treating-section-side transport portion 91 has the first treating-section-side transport mechanism TC1 and second treating-section-side transport mechanism TC2 installed therein. The transport mechanisms TC1 and TC2 are arranged along the front face 17F of the IF section 17. That is, the transport mechanisms TC1 and TC2 are arranged side by side in the y-direction. The transport mechanisms TC1 and TC2 are each arranged in a position close to the front face 17F of the IF section 17. The transport mechanisms TC1 and TC2 each face the front face 17F of the IF section 17. The exposing-machine-side transport portion 92 has the exposing-machine-side transport mechanism TD installed therein.

The IF section 17 (treating-section-side transport portion 91) and the treating section 13 (transport portion 61) have receivers P5S, P5R, P6S and P6R provided therebetween. These receivers P5S and so on are arranged vertically. That is, these receivers P5S and so on are arranged in the same position in plan view. The receivers P5S/P5R are used for transferring wafers W between the transport mechanism TC1 and the transport mechanism TB1$d$. The receivers P6S/P6R are used for transferring wafers W between the transport mechanism TC2 and the transport mechanism TB2$d$.

The receivers P5S, P5R, P6S and P6R are arranged in positions substantially equidistant from the transport mechanisms TC1 and TC2. The distance between the receivers P5S and P5R and the transport mechanism TC1 and the distance between the receivers P6S and P6R and the transport mechanism TC2 are substantially equal. Specifically, the receivers P5S and so on are arranged on a perpendicular bisector of a line segment extending between the transport mechanisms TC1 and TC2 in plan view.

Receivers P7S and P7R, a feed buffer unit SBF, a return buffer unit RBF and receiving and cooling units P-CP are arranged between the treating-section-side transport portion 91 and the exposing-machine-side transport portion 92. These receivers P7S, P7R and so on are stacked in the vertical direction. That is, these receivers P7S and so on are arranged in the same position in plan view. The buffer units SBF and RBF are arranged at upper stages, the receivers P7S and P7R are arranged at middle stages, and the receiving and cooling units P-CP are arranged at lower stages. The receivers P7S and so on are also arranged in positions substantially at an equal distance from the transport mechanisms TC1 and TC2. The distance between the receivers P7S and so on and the transport mechanism TC1 and the distance between the receiver P7S and so on and the transport mechanism TC2 are substantially equal.

The receiver P7S is used when the transport mechanisms TC1 and TC2 pass wafers W to the transport mechanism TD. The receiver P7R is used when the transport mechanism TD passes wafers W to the transport mechanisms TC1 and TC2. The buffer units SBF and RBF temporarily hold wafers W on standby. The receiving and cooling units P-CP maintain (cool) wafers W placed thereon at a predetermined temperature. The transport mechanisms TC1 and TC2 transport wafers W to and from the buffer units SBF and RBF and the receiving and cooling units P-CP. The transport mechanism TD may transport wafers W to and from at least either of the buffer units SBF and RBF or the receiving and cooling unit P-CP.

The receivers P5S, P5R, P6S and P6R correspond to the points m2, m3, m6 and m7 in FIG. 1, respectively. The receivers P7S and P7R correspond to the points n1 and n2 in FIG. 1. The receivers P5S, P5R, P6S and P6R correspond to the treating-section-side receivers in this invention. The receivers P7S and P7R correspond to the intermediate receivers in this invention.

The cleaning portion 95 is located adjacent and laterally of the transport mechanism TC1. The transport mechanism TC1 solely transports wafers W to and from the cleaning portion 95. The cleaning portion 95 has before-exposure cleaning units 101 and after-exposure cleaning units 102. The former will be abbreviated to "pre-cleaning units 101" and the latter to "post-cleaning units 102" as appropriate. The cleaning units 101 and 102 are arranged vertically. Two post-cleaning units 102 are arranged at upper stages, and three pre-cleaning units 101 are arranged at lower stages. Each of the cleaning units 101 and 102 faces the transport mechanism TC1. Specifically, each treating unit 101 or 102 has an opening "a" for letting wafers W in and out. Each opening "a" faces the transport mechanism TC1.

The pre-cleaning units 101 clean and dry wafers W before exposing treatment. Where the exposing machine EXP employs an immersion method, it is preferable that the pre-cleaning units 101 to supply a cleaning liquid to the back surfaces of wafers W for cleaning the back surfaces of wafers W. When cleaning the wafers W, the wafers W may be rotated and/or brushes may be used. This can conveniently prevent contamination of wafer-holding stages in the exposing machine EXP. The back surfaces of the wafers W are surfaces reverse to the surfaces on which the resist film and the like are formed.

The post-cleaning units 102 clean and dry wafers W after exposing treatment. This can conveniently clean the wafers W exposed by the immersion method.

The cleaning portion 96 is similar in construction to the cleaning portion 95. The transport mechanism TC2 transports wafers W to and from the cleaning units 101 and 102 installed in the cleaning portion 96.

The cleaning portion 95 corresponds to the first cleaning portion in this invention. The cleaning portion 96 corresponds to the second cleaning portion in this invention.

The heat treating portion 97 is located adjacent and rearward of the transport mechanism TC1. The transport mechanism TC1 solely transports wafers W to and from the heat treating portion 97. The heat treating portion 97 has a plurality of post-exposure baking units PEB. The post-exposure baking units PEB are arranged vertically. The post-exposure baking units PEB have substantially the same installation height as the post-cleaning units 102 of the cleaning portion 95. The post-exposure baking units PEB of the heat treating portion 97 and the post-cleaning units 102 of the cleaning portion 95 are arranged around the transport mechanism TC1. As seen from the transport mechanism TC1, the post-exposure baking units PEB and the post-cleaning units 102 are arranged adjacent each other in the circumferential direction. Each post-exposure baking unit PEB faces the treating-section-side transport portion 91. Specifically, each post-exposure baking unit PEB has an opening "b" for letting wafers W in and out. Each opening "b" faces the transport mechanism TC1. Each post-exposure baking unit PEB carries out post-exposure heat treatment (Post Exposure Bake) of the wafers W after exposing treatment.

The heat treating portion 98 is similar in construction to the heat treating portion 97. The transport mechanism TC2 transports wafers W to and from the post-exposure baking units PEB installed in the heat treating portion 98.

The post-exposure baking units PEB of the heat treating portion 97 correspond to the first post-exposure baking units in this invention. The post-exposure baking units PEB of the heat-treating portion 98 correspond to the second post-exposure baking units in this invention.

[Construction of Control System]

The substrate treating apparatus 1 has a controller 111 and an input/output unit 113.

The controller 111 is installed in the ID section 11, for example. The controller 111 carries out overall control of the ID section 11, treating section 13 and IF section 17. Specifically, the controller 111 controls operations of the various transport mechanisms and various treating units.

The input/output unit 113 is attached to a side wall of the ID section 11. The input/output unit 113 displays transport situations and treatment situations of wafers W in the substrate treating apparatus 1. The user can input to the input/output unit 113 commands relating to the displays on the input/output unit 113, and commands relating to operations of the various transport mechanisms and treating units.

[Operation of Substrate Treating Apparatus 1]

Next, operation of the substrate treating apparatus 1 in this embodiment will be described. The description will be made hereinafter separately on transport from the ID section 11 to the IF section 17, and on transport from the IF section 17 to the ID section 11.

[Transport from ID Section 11 to IF Section 17]

<ID Section 11>

The transport mechanism TA1 takes a wafer W out of one carrier C, and places it on the receiver P1S. The transport mechanism TA2 takes a wafer W out of the other carrier C, and places it on the receiver P2S. The wafer transport by the transport mechanism TA1 and the wafer transport by the transport mechanism TA2 are carried out independently of each other. The transport mechanisms TA1 and TA2 may be <Treating Section 13>

The transport mechanism TB1c receives the wafer W placed on the receiver P1S. Then, the transport mechanism TB1c transports the received wafer W to the various treating units in the coating treatment chambers 41 and 42 and the heat treating unit group 51 in a predetermined order. The transport mechanism TB1c transports the wafer W in the order, for example, of heat treating unit PHP, cooling unit CP, coating unit 45 for antireflection film, heat treating unit PHP, cooling unit CP, coating unit 45 for resist film, and heat treating unit PHP. Consequently, the wafer W receives the various types of treatment continually. The wafer W will have antireflection film and resist film formed thereon. The transport mechanism TB1c places the wafer W having received the series of treatments on the receiver P3S.

The transport mechanism TB1d receives the wafer W from the receiver P3S, and transports it to the various treating units in the coating treatment chamber 73 and the heat treating unit group 81 in a predetermined order. The transport mechanism TB1d transports the wafer W in the order, for example, of coating unit 45 for resist cover film, heat treating unit PHP and edge exposing unit EEW. Consequently, the wafer W receives the various types of treatment continually. The wafer W will have resist cover film formed thereon, and have the edges thereof exposed. The transport mechanism TB1d places the wafer W having received the series of treatments on the receiver P5S.

On the other hand, the transport mechanism TB2c transports the wafer W placed on the receiver P2S to the various treating units in the coating treatment chambers 43 and 44 and the heat treating unit group 52 in a predetermined order. Then, the transport mechanism TB2c places the wafer W on the receiver P4S. The transport mechanism TB2d transports the wafer W placed on the receiver P4S to the various treating units in the coating treatment chamber 74 and the heat treating unit group 82 in a predetermined order. Subsequently, the transport mechanism TB2d places the wafer W on the receiver P6S.

<IF Section 17>

The transport mechanism TC1 receives the wafer W placed on the receiver P5S, and carries it into a pre-cleaning unit 101 in the cleaning portion 95. The pre-cleaning unit 101 cleans the back surface of the wafer W. Then, the transport mechanism TC1 takes the wafer W out of the pre-cleaning unit 101, and places it on the receiver P7S.

The transport mechanism TC2 receives the wafer W placed on the receiver P6S, and transports it to a pre-cleaning unit 101 in the cleaning portion 96. The transport mechanism TC2 takes the wafer W out of the pre-cleaning unit 101, and places it on the receiver P7S.

When the wafer W cannot be placed on the receiver P7S, the transport mechanism TC1/TC2 places the wafer W in the feed buffer unit SBF or a receiving and cooling unit P-CP.

The transport mechanism TD receives the wafer W placed on the receiver P7S, and feeds it to the exposing machine EXP. The wafer W is exposed by the exposing machine EXP.

[Transport from IF Section 17 to ID Section 11]
<IF Section 17>

The transport mechanism TD receives wafers W from the exposing machine EXP, and places them on the receiver P7S.

The transport mechanism TC1 receives a wafer W placed on the receiver P7R, and transports it to a post-cleaning unit 102 in the cleaning portion 95 and to a post-exposure baking unit PEB in the heat treating portion 97 in the stated order. The post-cleaning unit 102 cleans the wafer W, and the post-exposure baking unit PEB gives post-exposure baking treatment to the wafer W. The transport mechanism TC1 places the wafer W having received the series of treatments on the receiver P5R.

The transport mechanism TC2 receives a wafer W placed on the receiver P7R, and transports it to a post-cleaning unit 102 in the cleaning portion 96 and to a post-exposure baking unit PEB in the heat-treating portion 98. Subsequently, the transport mechanism TC2 places the wafer W on the receiver P6R.

<Treating Section 13>

The transport mechanism TB1d receives the wafer W placed on the receiver P5R, and transports it to the various treating units in the developing treatment chamber 71 and the heat treating unit group 81 in a predetermined order. The transport mechanism TB1d transports the wafer W in the order, for example, of cooling unit CP, developing unit 75 and heat treating unit PHP. Consequently, the wafer W is developed. Then, the transport mechanism TB1d places the developed wafer W on the receiver P3R. The transport mechanism TB1c receives the wafer W from the receiver P3R, and places it on the receiver P1R.

On the other hand, the transport mechanism TB2d transports the wafer W placed on the receiver P6R to the various treating units in the developing treatment chamber 72 and the heat treating unit group 82 in a predetermined order. Then, the transport mechanism TB2d places the wafer W on the receiver P4R. The transport mechanism TB2c receives the wafer W placed on the receiver P4R, and places it on the receiver P2R.

<ID Section 11>

The transport mechanism TA1 receives the wafer W placed on the receiver P1R, and carries it into a carrier C. The transport mechanism TA2 receives the wafer W placed on the receiver P2R, and carries it into a carrier C.

[Operations of Transport Mechanisms TC1 and TC2]

Next, operations of the transport mechanisms TC1 and TC2 will be described in detail. Since the operation of the transport mechanism TC2 is basically the same as the operation of the transport mechanism TC1, only the operation of the transport mechanism TC1 will be described.

The transport mechanism TC1 moves to a position facing the receivers P5S/P5R. At this time, the transport mechanism TC1 is holding a wafer W taken out of a post-exposure baking unit PEB. The transport mechanism TC1 places the wafer W it is holding on the receiver P5R, and receives a wafer W present on the receiver P5S.

Next, the transport mechanism TC1, while holding the wafer W, makes a rotating movement and a downward movement to a position facing a pre-cleaning unit 101. The transport mechanism TC1 takes a treated wafer W out of the pre-cleaning unit 101, and loads the wafer W received from the receiver P5S into the pre-cleaning unit 101.

Next, the transport mechanism TC1 makes a rotating movement to move to a position facing the receiver P7S. The transport mechanism TC1 places the wafer W taken out of the pre-cleaning unit 101 on the receiver P7S, and receives a wafer W present on the receiver P7R.

Next, the transport mechanism TC1 makes an upward movement and a rotating movement to a position facing a post-cleaning unit 102. The transport mechanism TC1 replaces a wafer W in the post-cleaning unit 102 with the wafer W received from the receiver P7R.

Next, the transport mechanism TC1 makes a rotating movement to a position facing a post-exposure baking unit PEB. The transport mechanism TC1 replaces a wafer W in the post-exposure baking unit PEB with the wafer W taken from the post-cleaning unit 102.

Subsequently, the transport mechanism TC1 moves to the position facing the receivers P5S/P5R again, and repeats the series of steps described above.

Thus, according to the substrate treating apparatus 1 in this embodiment, the IF section 17 includes the transport mechanisms TC1 and TC2. Therefore, as described in [Outline of Substrate Treating Apparatus] hereinbefore, even when one of the transport mechanisms TC1 and TC2 comes to a stoppage, there is no possibility of stagnation in the transport of wafers W between the treating section 13 and the IF section 17. This can improve the reliability of wafer transport in the IF section 17.

The transport mechanisms TC1 and TC2 are arranged along the front face 17F of the IF section 17 bordering the treating section 13. Therefore, wafers W can be smoothly carried into and out of the treating section 13.

The IF section 17 has a plurality of post-exposure baking units PEB, and each transport mechanism TC1 or TC2 transports wafers W to and from the post-exposure baking units PEB. Therefore, even when one of the transport mechanisms TC1 and TC2 comes to a stoppage, exposed wafers W can be given post-exposure baking treatment according to a fixed schedule. That is, variations are inhibited from occurring to the schedule of post-exposure baking treatment of the exposed wafers W. Here, the schedule refers to the time taken from the exposing machine EXP outputting wafers W to the post-exposure baking treatment given to the wafers W by the post-exposure baking units PEB. Therefore, the quality of treatment of the wafers W can be maintained effectively. A schedule when one of the transport mechanisms TC1 and TC2 is at stoppage may be the same as the schedule when both the transport mechanisms TC1 and TC2 operate normally.

The post-exposure baking units PEB of the heat treating portion 97 adjoin the transport mechanism TC1, and the post-exposure baking units PEB of the heat treating portion 98 adjoin the transport mechanism TC2. Therefore, each of the transport mechanisms TC1 and TC2 can transport wafers W efficiently to the post-exposure baking units PEB.

With the post-exposure baking units PEB arranged above the transport mechanism TD, the IF section 17 takes up a reduced installation area.

The IF section 17 has a plurality of cleaning portions 95 and 96, and the transport mechanisms TC1 and TC2 transport wafers W to and from the cleaning portions 95 and 96, respectively. Therefore, even when one of the transport mechanisms TC1 and TC2 comes to a stoppage, the other can operate to have the wafers W cleaned.

The cleaning portion 95 adjoins the transport mechanism TC1, and the cleaning portion 96 adjoins the transport mechanism TC2. Therefore, the transport mechanisms TC1 and TC2 can transport wafers W promptly to the cleaning portions 95 and 96, respectively.

The cleaning portions 95/96 have the post-cleaning units 102, and both the cleaning units 102 and the post-exposure baking units PEB are arranged in upper parts of the IF section 17. Therefore, when moving wafers W between the post-cleaning units 102 and the post-exposure baking units PEB, the amounts of vertical movement for moving the wafers W up and down are relatively small. Therefore, the transport mechanisms TC1/TC2 can transport the exposed wafers W promptly to the various treating units 102 and PEB.

Further, as seen from the transport mechanisms TC1/TC2, the post-cleaning units 102 are located sideways, and the post-exposure baking units PEB are located rearward. Therefore, when the transport mechanisms TC1/TC2 transport wafers W between the post-cleaning units 102 and the post-exposure baking units PEB, the amounts of turning of the transport mechanisms TC1/TC2 are relatively small (e.g. about 90 degrees). Therefore, the transport mechanisms TC1/TC2 can transport the wafers W at increased speed.

The cleaning portions 95/96 have the pre-cleaning units 101, and the pre-cleaning units 101 are arranged under the post-cleaning units 102. Therefore, each of the cleaning portions 95 and 96 takes up a reduced installation area.

The receivers P7S/P7R adjoin both the transport mechanisms TC1 and transport mechanism TC2. Therefore, the transport mechanisms TC1 and TC2 can transport wafers W promptly to or from the receivers P7S/P7R, respectively.

Similarly, since the receivers P5S/P5R adjoin the transport mechanism TC1, the transport mechanism TC1 can transport wafers W promptly to or from the receivers P5S/P5R. Since the receivers P6S/P6R adjoin the transport mechanism TC2, the transport mechanism TC2 can transport wafers W promptly to or from the receivers P6S/P6R.

Further, in plan view, the post-exposure baking units PEB, cleaning portion 95, receivers P7S/P7R and receivers P5S/P5R (hereinafter called "post-exposure baking units PEB and so on") are arranged so as to surround the transport mechanism TC1. Therefore, the transport mechanism TC1, only by rotating without making parallel translation in the x-direction or y-direction, can successively face these post-exposure baking units PEB and so on. This can improve the efficiency of transporting wafers W by the transport mechanism TC1, and can shorten transporting time by the transport mechanism TC1. The same can be said of the transport mechanism TC2.

The treating section 13 has two transport paths formed therethrough by the transport mechanisms TB1c/TB1d and the transport mechanisms TB2c/TB2d. Therefore, even when one transport path stops in the treating section 13, the other transport path can be used. This can also improve the reliability of wafer transport through the treating section 13.

The ID section 11 has two transport mechanisms TA1 and TA2. Therefore, even when one of the transport mechanisms TA1 and TA2 comes to a stoppage, the other will operate so that there be no possibility of stagnation in the transport of wafers W in the ID section 11. This can improve the reliability of wafer transport in the ID section 11.

This invention is not limited to the foregoing embodiment, but may be modified as follows:

(1) The foregoing embodiment gives no specific number of hands H provided for the transport mechanisms TC1 and TC2. Any arbitrary number can be selected as appropriate. That is, each of the transport mechanisms TC1 and TC2 may have one hand H or two or more hands H.

Where each of the transport mechanisms TC1 and TC2 has three hands H, the hands H may be used as follows, respectively. The first hand H is used exclusively in a section from an operation to receive a wafer W placed on the receiver P5S to an operation to feed the wafer W into a pre-cleaning unit 101. The second hand H is used exclusively in a section from an operation to take the wafer W out of the pre-cleaning unit 101 to an operation to place it on the receiver P7S. The third hand H is used exclusively in a section from an operation to receive the wafer W from the receiver P7R to an operation to place it on the receiver P5R. Thus, a wafer W is held by one hand H up to loading into a pre-cleaning unit 101 and by the other hands H when and after unloaded from the pre-cleaning unit 101. According to such allocated use, even when the wafer W placed on the receiver P5S or the first hand H is contaminated with particles, the wafer W can be cleaned in the pre-cleaning unit 101. And the cleaned wafer W can be transported to the exposing machine EXP, and can be maintained in the clean state until it is placed on the receiver P5R.

(2) In the foregoing embodiment, the post-exposure baking units PEB are arranged above the transport mechanism TD. This is not limitative. The position of the transport mechanism TD may be selected or varied appropriately according to specifications of the exposing machine EXP. The specifications include, for example, the positions of inlet/outlet ports of the exposing machine EXP for receiving and delivering wafers W. It is preferable, for example, to place the transport mechanism TD in a position for efficiently transferring wafers W to and from the exposing machine EXP. The arrangement of the post-exposure baking units PEB can be changed as appropriate according to the position of the transport mechanism TD. As a result, for example, the transport mechanism TD may be placed in an upper part of the IF section 17, with the post-exposure baking units PEB arranged below the transport mechanism TD. Or the transport mechanism TD may be placed in a vertically middle part of the IF section 17, with the post-exposure baking units PEB arranged separately above and below the transport mechanism TD.

When the arrangement of the post-exposure baking units PEB is changed, the arrangement of the post-cleaning units 102 may be changed as appropriate. For example, the post-cleaning units 102 may be arranged in substantially the same height positions as the post-exposure baking units PEB.

Further, when the arrangement of the post-cleaning units 102 is changed, the arrangement of the pre-cleaning units 101 may be changed as appropriate. In this case also, the pre-cleaning units 101 and post-cleaning units 102 may be stacked in the vertical direction. For example, the pre-cleaning units 101 may be arranged above the post-cleaning units 102. The pre-cleaning units 101 may be arranged above and below the post-cleaning units 102.

(3) In the foregoing embodiment, two transport paths are formed not only in the IF section 17 but also in the ID section 11 and treating section 13. This is not limitative. For example, the ID section 11 may have one transport path, or three or more transport paths. In other words, one of the transport mechanisms TA1 and TA2 may be omitted, or in addition to the transport mechanisms TA1 and TA2, a transport mechanism TA3 or more may be installed in the ID section 11. Similarly, the treating section 13 may have one transport path or three or more transport paths.

(4) In the foregoing embodiment, the transport mechanism TB1 is made up of two transport mechanisms TB1c and TB1d. This is not limitative.

For example, the transport mechanism TB1 may consist of one transport mechanism. In this case, for example, the following construction is adopted. The one transport mechanism moves in the x-direction through the transport portion 31 and transport portion 61. And the one transport mechanism transports wafers W to and from the various treating units belonging to the treating unit UB1 and to and from the receivers P1S, P1R, P5S and P5R. In this modified embodiment, the receivers P3S and P3R can be omitted.

Alternatively, the transport mechanism TB1 may consist of three or more transport mechanisms. In this case, the following construction is adopted. The three or more transport mechanisms are arranged in a line along the x-direction through the transport portion 31 and transport portion 61. Receivers are installed appropriately between the transport mechanisms. And while each transport mechanism takes its share of work in transporting wafers W to and from the various treating units belonging to the treating unit UB1, an adjacent pair of transport mechanisms feed the wafers W in two directions through the receivers.

Similar changes may be made to the transport mechanism TB2 also.

(5) The foregoing embodiment shows, by way of example, that the exposing machine EXP performs exposing treatment by the immersion method. This is not limitative. For example, a change may be made to an exposing apparatus which performs exposing treatment without using a liquid.

(6) In the foregoing embodiment, the IF section 17 has the cleaning portions 95/96 and the heat treating portions 97/98. This is not limitative. The treating portions installed in the IF section 17 may be selected or varied as appropriate. For example, the cleaning portions 95/96 may be omitted, or the heat treating portions 97/98 may be omitted. A change may be made to install treating portions that perform treatment different to the cleaning portions 95/96 and heat treating portions 97/98.

(7) In the foregoing embodiment, the treating section 13 performs the treatment for forming resist film and the like on wafers W and developing the wafers W. This is not limitative. The contents of the treatment in the treating section 13 may be changed as appropriate.

(8) Changes may be made to combine appropriately the constructions of the foregoing embodiment and each modified embodiment.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
   an indexer section;
   a treating section disposed adjacent the indexer section for treating substrates; and
   an interface section disposed adjacent the treating section and adjacent an exposing machine provided separately from the apparatus;
   the treating section including:
     a first treating-section transport mechanism for transporting the substrates between the indexer section and the interface section;
     a first treating unit to and from which the substrates are transported solely by the first treating-section transport mechanism;
     a second treating-section transport mechanism for transporting the substrates between the indexer section and the interface section; and
     a second treating unit to and from which the substrates are transported solely by the second treating-section transport mechanism;
   the interface section including:
     a first treating-section-side transport mechanism;
     a second treating-section-side transport mechanism; and
     an exposing-machine-side transport mechanism;
   wherein the first treating-section-side transport mechanism is arranged to receive the substrates from the first treating-section transport mechanism, pass the substrates to the exposing-machine-side transport mechanism, receive the substrates from the exposing-machine-side transport mechanism and pass the substrates to the first treating-section transport mechanism without passing through the second treating-section-side transport mechanism;

the second treating-section-side transport mechanism is arranged to receive the substrates from the second treating-section transport mechanism, pass the substrates to the exposing-machine-side transport mechanism, receive the substrates from the exposing-machine-side transport mechanism and pass the substrates to the second treating-section transport mechanism without passing through the first treating-section-side transport mechanism, and the exposing-machine-side transport mechanism is arranged to receive the substrates from the first and second treating-section-side transport mechanisms, transport the substrates to the exposing machine, receive the substrates after exposing treatment from the exposing machine, and pass the substrates to the first and second treating-section-side transport mechanisms;

the first and second treating-section transport mechanisms are arranged one over the other in a vertical direction;

the first and second treating-section-side transport mechanisms are arranged side by side in a horizontal direction;

the treating section is shaped rectangular in plan view;

the interface section is shaped rectangular in plan view;

the interface section is disposed rearward of the treating section;

the first and second treating-section-side transport mechanisms are juxtaposed along a front face of the interface section adjacent the treating section; and the first treating-section-side transport mechanism is located in the same height position as the second treating-section-side transport mechanism.

2. The substrate treating apparatus according to claim 1 wherein the interface section includes post-exposure baking units arranged in the interface section for heating the substrates after the exposing treatment;

the first treating-section-side transport mechanism transports the substrates to and from the post-exposure baking units without passing through the second treating-section-side transport mechanism;

the second treating-section-side transport mechanism transports the substrates to and from the post-exposure baking units without passing through the first treating-section-side transport mechanism; and the post-exposure baking units adjoin the first and second treating-section-side transport mechanisms.

3. The substrate treating apparatus according to claim 2 wherein the exposing-machine-side transport mechanism and the post-exposure baking units are arranged rearward of the first and second treating-section-side transport mechanisms;

the post-exposure baking units are arranged above or below the exposing-machine-side transport mechanism; and the post-exposure baking units and the exposing-machine-side transport mechanism are arranged vertically in side view.

4. The substrate treating apparatus according to claim 2 wherein the post-exposure baking units include:

first post-exposure baking units to and from which the substrates are transported solely by the first treating-section-side transport mechanism; and second post-exposure baking units to and from which the substrates are transported solely by the second treating-section-side transport mechanism; and wherein the first post-exposure baking units adjoin the first treating-section-side transport mechanism;

the second post-exposure baking units adjoin the second treating-section-side transport mechanism; and the first post-exposure baking units are located in the same height position as the second post-exposure baking units.

5. The substrate treating apparatus according to claim 1 wherein the interface section includes a cleaning portion disposed in the interface section for cleaning the substrates;

the first treating-section-side transport mechanism transports the substrates to and from the cleaning portion without passing through the second treating-section-side transport mechanism;

the second treating-section-side transport mechanism transports the substrates to and from the cleaning portion without passing through the first treating-section-side transport mechanism;

the first treating-section-side transport mechanism receives the substrates from the exposing-machine-side transport mechanism without passing through the cleaning portion;

the second treating-section-side transport mechanism receives the substrates from the exposing-machine-side transport mechanism without passing through the cleaning portion;

the exposing-machine-side transport mechanism passes the substrates to the first and second treating-section-side transport mechanisms without passing through the cleaning portion; and the cleaning portion adjoins the first and second treating-section-side transport mechanisms.

6. The substrate treating apparatus according to claim 5 wherein the cleaning portion is disposed laterally of the first and second treating-section-side transport mechanisms.

7. The substrate treating apparatus according to claim 5 wherein the cleaning portion includes:

pre-exposure cleaning units for cleaning the substrates before the exposing treatment; and post-exposure cleaning units for cleaning the substrates after the exposing treatment; and wherein the pre-exposure cleaning units and the post-exposure cleaning units are arranged vertically.

8. The substrate treating apparatus according to claim 5 wherein the cleaning portion includes:

a first cleaning portion to and from which the substrates are transported solely by the first treating-section-side transport mechanism; and a second cleaning portion to and from which the substrates are transported solely by the second treating-section-side transport mechanism; and wherein the first cleaning portion, the first and second treating-section-side transport mechanisms and the second cleaning portion are juxtaposed in the stated order along a front face of the interface section.

9. The substrate treating apparatus according to claim 1 wherein the interface section includes:

post-exposure baking units for heating the substrates after the exposing treatment; and
a cleaning portion for cleaning the substrates; and
wherein each of the first and second treating-section-side transport mechanisms transports the substrates to and from the post-exposure baking units and the cleaning portion;
the cleaning portion includes post-exposure cleaning units for cleaning the substrates after the exposing treatment; and
the post-exposure cleaning units are arranged in substantially the same height position as the post-exposure baking units.

10. The substrate treating apparatus according to claim 1 comprising:
treating-section-side receivers for allowing the first and second treating-section-side transport mechanisms to receive the substrates from the treating section and pass the substrates to the treating section;
wherein the treating-section-side receivers are arranged between the treating section and the interface section, and in positions substantially equidistant from the first and second treating-section-side transport mechanisms.

11. The substrate treating apparatus according to claim 1 wherein
the interface section includes intermediate receivers for allowing the first and second treating-section-side transport mechanisms and the exposing-machine-side transport mechanism to transfer the substrates between each other; and
the intermediate receivers are arranged in positions substantially equidistant from the first and second treating-section-side transport mechanisms.

12. The substrate treating apparatus according to claim 1 wherein
the interface section includes:
post-exposure baking units arranged in the interface section for heating the substrates after the exposing treatment; and
intermediate receivers arranged in the interface section for allowing the first and second treating-section-side transport mechanisms and the exposing-machine-side transport mechanism to transfer the substrates between each other;
the post-exposure baking units include:
first post-exposure baking units to and from which the substrates are transported solely by the first treating-section-side transport mechanism; and
second post-exposure baking units to and from which the substrates are transported solely by the second treating-section-side transport mechanism; and
wherein the first post-exposure baking units and the intermediate receivers are arranged around the first treating-section-side transport mechanism, so that the first treating-section-side transport mechanism, by rotating, can face the first post-exposure baking units and the intermediate receivers; and
the second post-exposure baking units and the intermediate receivers are arranged around the second treating-section-side transport mechanism, so that the second treating-section-side transport mechanism, by rotating, can face the second post-exposure baking units and the intermediate receivers.

13. The substrate treating apparatus according to claim 12 wherein:
the first post-exposure baking units are arranged rearward of the first treating-section-side transport mechanism; and
the second post-exposure baking units are arranged rearward of the second treating-section-side transport mechanism;
the intermediate receivers are arranged rearward of the first and second treating-section-side transport mechanisms;
both the first treating-section-side transport mechanism and the first post-exposure baking units are arranged on one side of a perpendicular bisector of a horizontal line segment extending between the first treating-section-side transport mechanism and the second treating-section-side transport mechanism in plan view;
both the second treating-section-side transport mechanism and the second post-exposure baking units are arranged on the other side of the perpendicular bisector in plan view; and
the intermediate receivers are arranged on the perpendicular bisector in plan view.

14. The substrate treating apparatus according to claim 12 wherein:
the interface section includes a cleaning portion disposed in the interface section for cleaning the substrates;
the cleaning portion includes:
a first cleaning portion to and from which the substrates are transported solely by the first treating-section-side transport mechanism; and
a second cleaning portion to and from which the substrates are transported solely by the second treating-section-side transport mechanism; and
wherein the first post-exposure baking units, the intermediate receivers and the first cleaning portion are arranged around the first treating-section-side transport mechanism, so that the first treating-section-side transport mechanism, by rotating, can face the first post-exposure baking units, the intermediate receivers and the first cleaning portion; and
the second post-exposure baking units, the intermediate receivers and the second cleaning portion are arranged around the second treating-section-side transport mechanism, so that the second treating-section-side transport mechanism, by rotating, can face the second post-exposure baking units, the intermediate receivers and the second cleaning portion.

15. The substrate treating apparatus according to claim 14 wherein:
the first post-exposure baking units are arranged rearward of the first treating-section-side transport mechanism; and
the second post-exposure baking units are arranged rearward of the second treating-section-side transport mechanism;
the intermediate receivers are arranged rearward of the first and second treating-section-side transport mechanisms;
the first cleaning portion is disposed laterally of the first treating-section-side transport mechanism;
the second cleaning portion is disposed laterally of the second treating-section-side transport mechanism;
the first treating-section-side transport mechanism, the first post-exposure baking units and the first cleaning portion are arranged on one side of a perpendicular bisector of a horizontal line segment extending between the first treating-section-side transport mechanism and the second treating-section-side transport mechanism in plan view;

the second treating-section-side transport mechanism, the second post-exposure baking units and the second cleaning portion are arranged on the other side of the perpendicular bisector in plan view; and the intermediate receivers are arranged on the perpendicular bisector in plan view.

16. The substrate treating apparatus according to claim 14 wherein:

the first cleaning portion includes first post-exposure cleaning units for cleaning the substrates after the exposing treatment;

the second cleaning portion includes second post-exposure cleaning units for cleaning the substrates after the exposing treatment;

the first post-exposure cleaning units are arranged in the same height position as the first post-exposure baking units;

the first post-exposure baking units and the first post-exposure cleaning units are arranged adjacent each other circumferentially about the first treating-section-side transport mechanism;

the second post-exposure cleaning units are arranged in the same height position as the second post-exposure baking units; and the second post-exposure baking units and the second post-exposure cleaning units are arranged adjacent each other circumferentially about the second treating-section-side transport mechanism.

17. The substrate treating apparatus according to claim 16 wherein:

the intermediate receivers are arranged forward of the exposing-machine-side transport mechanism;

the intermediate receivers are arranged in the same height position as the exposing-machine-side transport mechanism; and the post-exposure baking units and the exposing-machine-side transport mechanism are arranged vertically in side view.

18. The substrate treating apparatus according to claim 1 wherein:

the interface section includes:

a cleaning portion disposed in the interface section for cleaning the substrates; and intermediate receivers arranged in the interface section for allowing the first and second treating-section-side transport mechanisms and the exposing-machine-side transport mechanism to transfer the substrates between each other;

the cleaning portion includes:

a first cleaning portion to and from which the substrates are transported solely by the first treating-section-side transport mechanism; and a second cleaning portion to and from which the substrates are transported solely by the second treating-section-side transport mechanism; and wherein the first cleaning portion and the intermediate receivers are arranged around the first treating-section-side transport mechanism, so that the first treating-section-side transport mechanism, by rotating, can face the first cleaning portion and the intermediate receivers; and the second cleaning portion and the intermediate receivers are arranged around the second treating-section-side transport mechanism, so that the second treating-section-side transport mechanism, by rotating, can face the second cleaning portion and the intermediate receivers.

19. The substrate treating apparatus according to claim 18 wherein:

the first cleaning portion is disposed laterally of the first treating-section-side transport mechanism; and the second cleaning portion is disposed laterally of the second treating-section-side transport mechanism;

the intermediate receivers are arranged rearward of the first and second treating-section-side transport mechanisms;

both the first treating-section-side transport mechanism and the first cleaning portion are arranged on one side of a perpendicular bisector of a horizontal line segment extending between the first treating-section-side transport mechanism and the second treating-section-side transport mechanism in plan view;

both the second treating-section-side transport mechanism and the second cleaning portion are arranged on the other side of the perpendicular bisector in plan view; and the intermediate receivers are arranged on the perpendicular bisector in plan view.

* * * * *